United States Patent [19]

Moroi

[11] Patent Number: 4,960,298

[45] Date of Patent: Oct. 2, 1990

[54] SEMICONDUCTOR WAFER PICK-UP DEVICE

[75] Inventor: Masayuki Moroi, Tsuchiura, Japan

[73] Assignee: Texas Instruments Incorporated, Dallas, Tex.

[21] Appl. No.: 287,367

[22] Filed: Dec. 20, 1988

[51] Int. Cl.⁵ .......................................... B25J 15/06
[52] U.S. Cl. ................................. 294/64.1; 294/86.4; 901/40; 901/45; 29/743
[58] Field of Search ............ 294/64.1, 27.1, 34, 294/65, 86.4, 103.1; 901/40, 30, 45, 49; 29/743; 414/627; 269/21

[56] References Cited

U.S. PATENT DOCUMENTS

| | | | |
|---|---|---|---|
| 4,557,514 | 12/1985 | Cushman et al. | 294/64.1 |
| 4,600,228 | 7/1986 | Tarbuck | 901/40 X |
| 4,648,588 | 3/1987 | Carrell | 901/40 X |
| 4,720,130 | 1/1988 | Andou | 901/40 X |
| 4,763,941 | 8/1988 | Sniderman | 294/64.1 |
| 4,768,919 | 9/1988 | Borgman et al. | 901/40 X |

FOREIGN PATENT DOCUMENTS

| | | | |
|---|---|---|---|
| 2359763 | 6/1974 | Fed. Rep. of Germany ... | 901/40 X |
| 2629160 | 1/1978 | Fed. Rep. of Germany ..... | 294/64.1 |
| 2040681 | 1/1971 | France ............. | 901/40 X |
| 753771 | 8/1980 | U.S.S.R. .................. | 294/64.1 |

Primary Examiner—Johnny D. Cherry
Assistant Examiner—Dean J. Kramer
Attorney, Agent, or Firm—Gary C. Honeycutt; Melvin Sharp; N. Rhys Merrett

[57] ABSTRACT

The invention is a device for picking-up a semiconductor wafer without using the edges of the wafer thereby eliminating stress to the wafer. The picker moves up and down within a robotic arm and comes to rest in the same location each time through the use of tapered posts.

7 Claims, 5 Drawing Sheets

SEMICONDUCTOR WAFER PICK-UP DEVICE

FIELD OF THE INVENTION

This invention relates to continuous chemical vapor deposition reactors, and more particularly to improvements in semiconductor wafer pick-up devices for use with such reactors.

BACKGROUND OF THE INVENTION

A continuous chemical deposition reactor may be a stand-alone process system with a continuous semiconductor wafer flow. Basic subsystems in such a system may include a wafer handling, a reaction chamber, a gas flow system, a cooling system, and an electrical system.

The wafer handling system may include wafer loaders and unloaders, wafer carriers, and a track for moving a wafer through the reactor chambers. The semiconductor wafers are orientated to a known position so that pick-up devices may properly place the wafer in a carrier, which is indexed through the reactor system.

A basic reactor and process may be as follows. A semiconductor wafer is first picked-up by a wafer handing device. The wafer is then oriented prior to be loading onto a carrier which enters one end of the reactor through a port and is moved successively through the various chambers and out the other end of the reactor through another port.

Each semiconductor wafer is a round disk with a flat edge thereon, the flat edge being used to permit orientation of the wafer for placement in a carrier prior to transporting the wafer through the process reactor.

The reactor may not be physically closed, but has gas seals at each end and in between each chamber of the reactor. As an example, a reactor may include eight chambers in which the first chamber consists of a nitrogen seal, the second chamber is a preheat chamber, the next four chambers may be deposition chambers, then a cool-down chamber and the last chamber is a nitrogen seal.

A typical gas supply system may supply gases for two different deposition processes which may be directed into any of the deposition chambers.

Each chamber is effectively divided into two portions, a top portion and a bottom portion by the substrate carrier. The junctions between the chambers effectively isolate one chamber from the other by the flow of gases, or the exhaust gases from the chambers.

SUMMARY OF THE INVENTION

The invention relates to devices for moving an oriented semiconductor wafer for placement in a semiconductor carrier which may be used in, for example, a multi-chamber continuous chemical vapor deposition reactor and subsystems therein through which substrates may be passed in order to perform etching and various deposition processes thereon. A semiconductor wafer is removed from a wafer cassette by a robotic arm which has a pick-up device which picks-up the wafer from the non-process side of the wafer without using the edge of the wafer, thus removing the tendency to stress, and eliminating the picker dimensional accuracy. The picker travels freely up and down and does not have to initially engage the surface of the wafer in a parallel orientation to eliminate stress or pressure being applied to the wafer. Tapered posts are used so that the picker mechanism seats in the same place or location each time a wafer is picked-up and is placed in a carrier.

Prior to placement in the carrier, the wafer must be centered and oriented so that the wafer may be place in the carrier without breaking the wafer. In this respect, since the wafer is generally round with a flat reference edge, the flat edge must be in a known position so that it may correspond to the flat orientation position in the carrier. To accomplish wafer orientation, the wafer is placed on a centering mechanism that has several tapered post. At least one of the tapered post is turned to rotate the wafer until the flat orientation flat on the wafer is positioned over an optical sensor. The tapered post centers the wafer and the optical sensor locates the orientation flat so that wafer may be picked up centered on the picker, and placed in the wafer carrier with the orientation flat on the wafer matching the flat on the carrier.

The surface of the pick-up device is coated with a material that will not scratch the semiconductor wafer, for example, a high molecular weight polyethylene material such as those know by trade names as TEFLON and DERIN.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1:
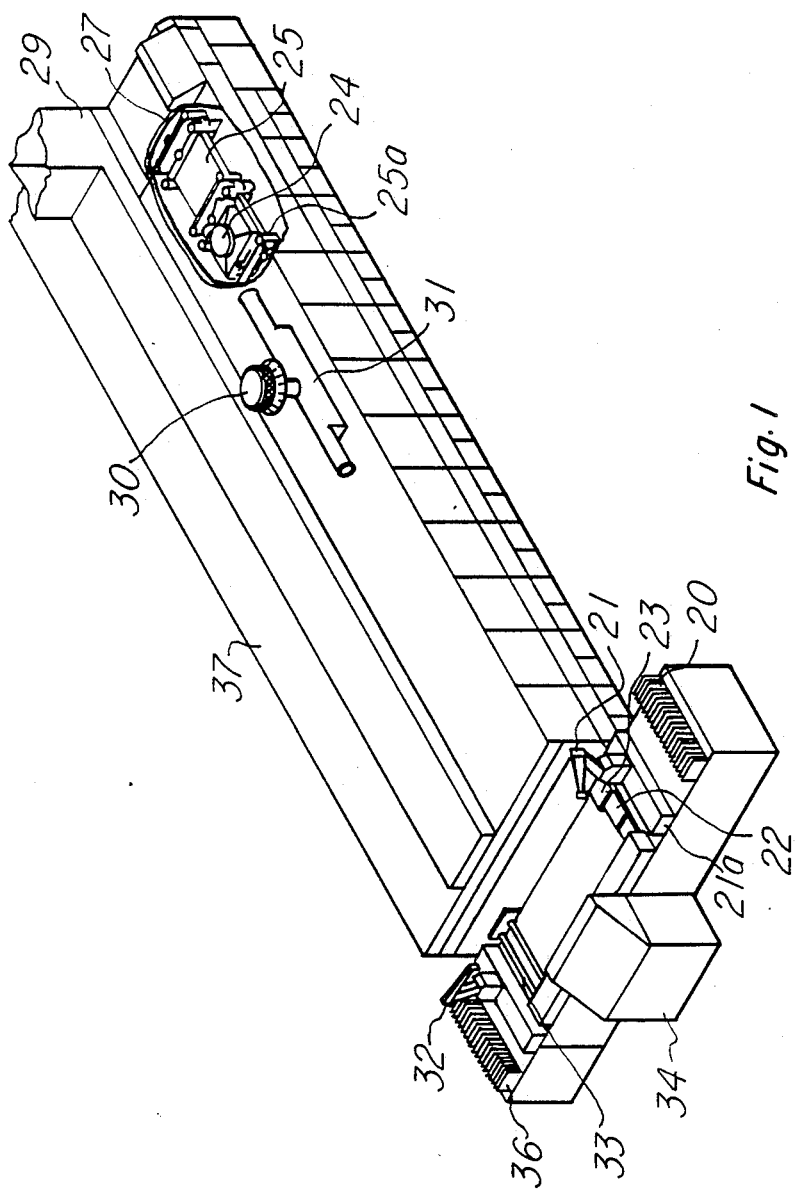
FIG. 1 illustrates a typical continuous chemical vapor deposition reactor in which the invention may be used.

FIG. 1 illustrates a typical reactor utilizing the present invention. A plurality of wafer cassettes 20 are located along and adjacent to a robotic arm 21 which moves along a track 21a. The track allows the robotic arm 21 to move adjacent each of a plurality of wafer cassettes so as to permit the robotic arm to access each wafer in each cassette. The robotic arm lifts a wafer from a cassette and places it in a carrier 22 at the entrance to the reactor. The entrance 23 to the reactor is a seal joint to prevent gases in the reactor from exiting from the reactor.

At the entrance 23, and before the carrier enters the reactor a vacuum pick-up arm (not illustrated) lifts the lid from the carrier to allow the robotic arm to place a semiconductor wafer into the carrier. After the semiconductor is placed into the carrier the carrier lid is replaced and the carrier is indexed through the reactor and the plurality of chambers that make up the reactor.

The carrier is indexed through the reactor and chambers using the length of the carrier and at least one spacer bar between each carrier. As each carrier is indexed into the reactor, each preceding carrier is moved to the next reactor chamber.

The indexing is continuous, and as the carrier exits from the last reaction chamber to the exit opening in the reactor, the lid of the carrier is removed by the return lid pick-up (not illustrated). Tracks 33, which extend through out the reactor, are used to move the wafer carrier through the reactor. A robotic arm 32 mounded on track 32a removes the semiconductor wafer from the carrier and places it in a wafer cassette 36.

The reactor is divided into a plurality of quartz reactor chambers 25. The reaction chambers 25 are joined by a junction 25a through which is introduced the process gases and from which the used gases are exhausted.

Positioned over each reaction chamber is a heater block 24, used to heat the reaction chamber to a desired temperature.

Each junction 25a has at least one exhaust tube 27 for removing exhaust gases from the reaction chambers. The exhaust gases are directed through a burn-off tube 31 to the gas burner 30.

The entire reactor is shrouded in an enclosure 37, and an air duct 29 is provided to circulate and exhaust gas-/air from inside the system shroud.

Figure 2:
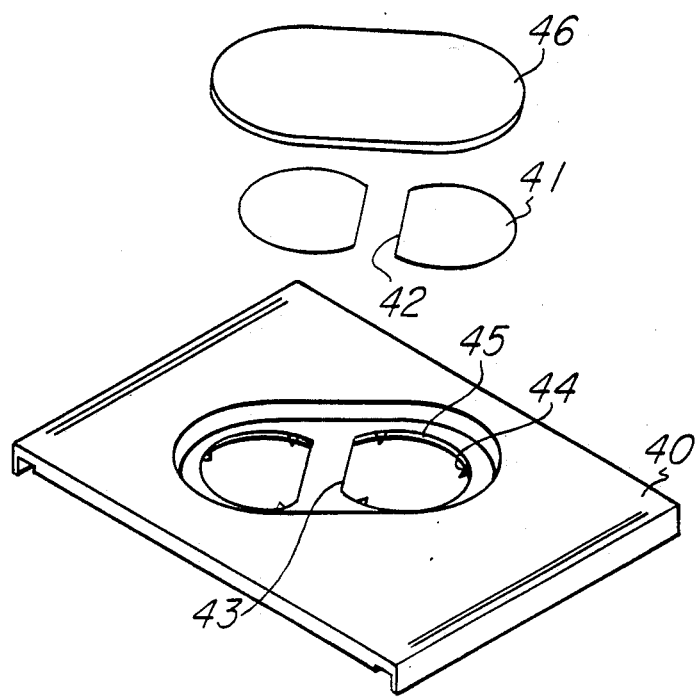
FIG. 2 illustrates an example of a semiconductor carrier with an orientation flat.

FIG. 2 illustrates a semiconductor carrier 40 having an opening 45 therein into which is placed a semiconductor wafer 41. The wafer has one flat edge 42 which is used to indexed or orientate the wafer. Opening 45 also has a flat side 43 to match the flat edge 42 of the semiconductor wafer. Tabs 44 protrude from the bottom of opening 45 to hold the semiconductor in the opening and to expose a maximum of the under side of the wafer, which is the process side of the wafer. A lid is used to cover the up or back side of the wafer during processing.

Figure 3:
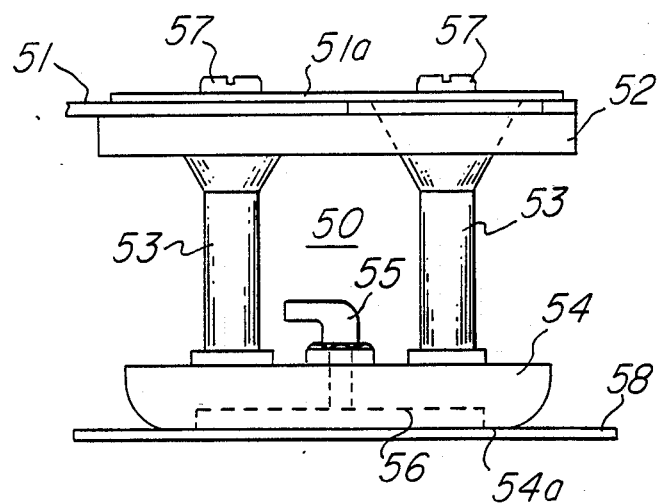
FIG. 3 illustrates a semiconductor picker of the present invention.

FIG. 3 illustrates the pick mechanism used on the end of a robotic arm to move the semiconductor wafer to be processed to a centering and orientating device. The mechanism 50 is movably mounted on an extension of the robotic arm 51,52, part 52 being a positioning block in which tapered holes 52a are used to position the conical parts 53a of posts 53. Pick-up device 50 includes two posts 53, each having one end tapered in a generally conical shape. The two posts 53 are mounted between upper plate 51a and low pick-up device 54. Plate 51 is secured to post 53 by screws 57. The post may be either bonded to or secured to pick-up device 54 by threaded holes (not shown).

Pick-up device 50 has a fitting 55 mounted thereon which attaches to a vacuum source (not illustrated) and opens into vacuum cavity 56 in the bottom surface of pick-up device 54. When pick-up device 54 is lowered into contact with a semiconductor device 58 with a vacuum applied, semiconductor wafer 58 will be drawn up against the bottom surface 54a of pick-up device 54 and held there until the vacuum is removed or released. While the semiconductor device is held against the bottom surface of the pick-up device it may be moved, for example from a loading surface/cassette to the centering and orientating mechanism described below.

Figure 4:
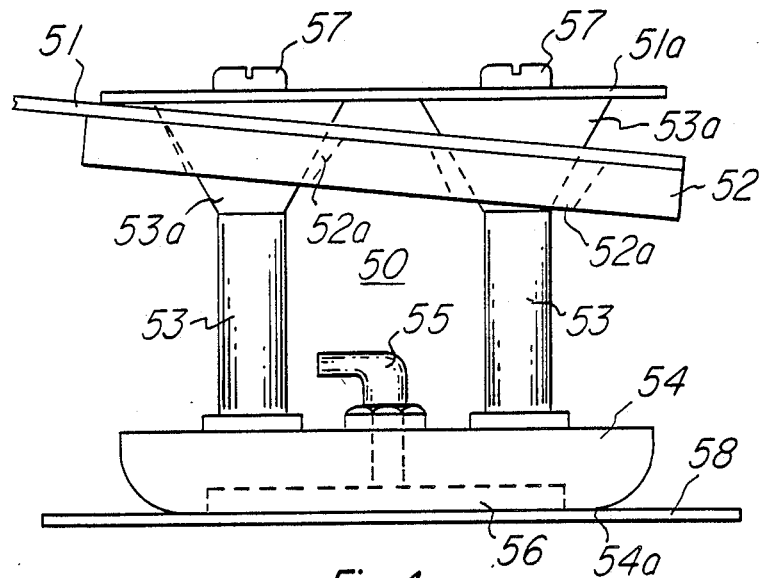
FIG. 4 illustrates the semiconductor picker of FIG. 3 in another position.

FIG. 4 illustrates the picking-up of a wafer without placing stress on the wafer, allowing a vacuum to be drawn against the wafer thereby allowing the wafer to be picked-up. In prior art reactor systems, the semiconductor wafer is usually processed face up so that the wafer has to be picked-up by the edge and not by a face of the wafer.

In the present invention, when robotic arm is lowered to pick-up a semiconductor wafer, the bottom surface of the pick-up device comes into contact with the bottom or non-process surface of semiconductor wafer 58. Since the robotic arm is being angled down, the bottom surface 54 does not move parallel into engagement with the surface of the semiconductor wafer. To avoid applying excessive pressure on the surface of the semiconductor wafer, and to permit the entire bottom surface 54a to come into contact with the semiconductor wafer surface, post 53 are not secured to arm 51 and part 52.

The tapered ends 53a of posts 53 reside in tapered holes 52 in robotic arm parts 51 and 52 such that when the arm 51 is lowered and surface 54a comes into contact with the surface of the semiconductor wafer, arm 51 may continue downward a short distant without addition pressure against the semiconductor wafer.

The movement of pick-up device 50 is essentially independent of the movement of arm 51 permitting the lower surface 54a to continue to move such that it becomes parallel to the surface of the semiconductor wafer, thereby permitting a vacuum to be drawn in vacuum cavity 56, holding and securing the semiconductor wafer to the bottom of the pick-up device.

When arm 51 is raised, the tapered part 53a of post 53 positions the pick-up device to a fixed and known position at the end of robotic arm 51, and therefore positions the semiconductor to a known position. This precise positioning of the pick-up device is important in later proper orienting the semiconductor wafer.

The pick-up device has been shown with two tapered posts 53, however, a single post may be used or, for example three post may be used. As long as the post are tapered, the accurate positioning will take place.

Figure 5:
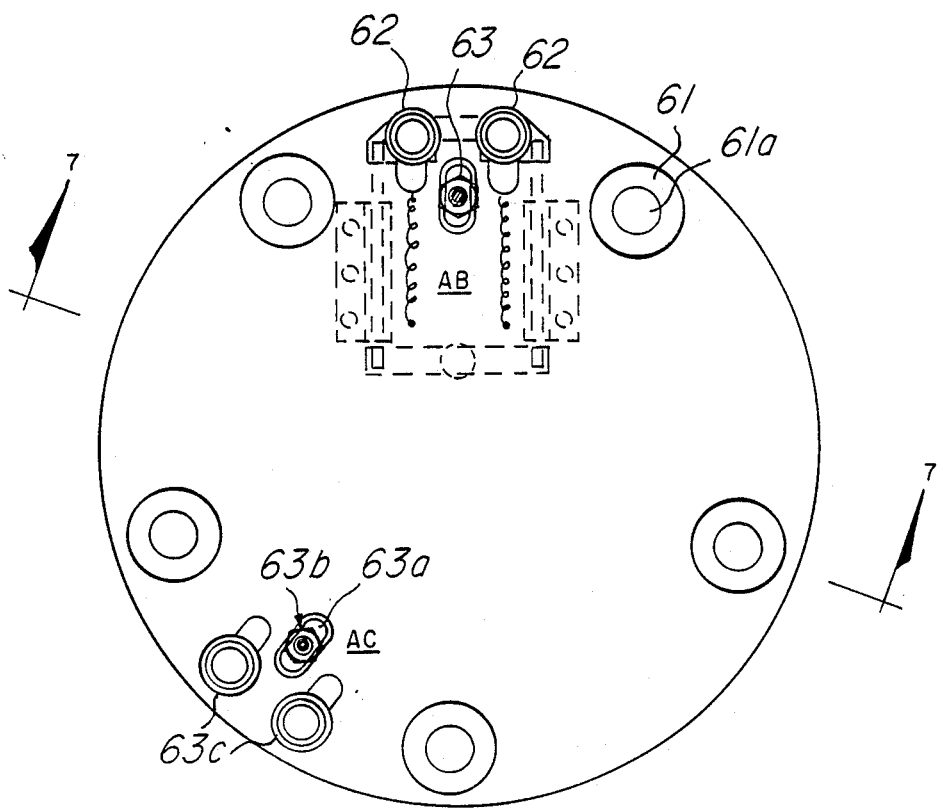
FIG. 5 illustrates a top view of the semiconductor wafer centering and orientation mechanism.
Figure 6:
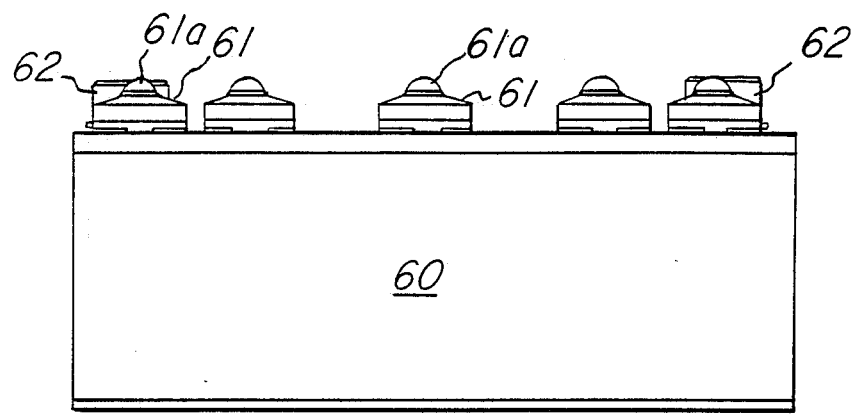
FIG. 6 is a side view of the centering and orientation mechanism of FIG. 5.
Figure 7:
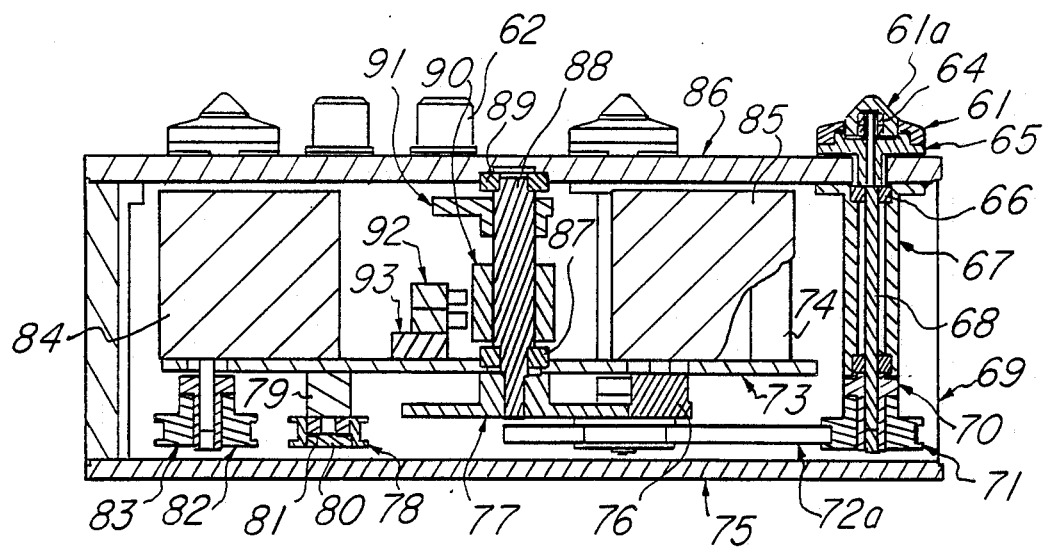
FIG. 7 is a side view in section of the centering and orientation mechanism of FIG. 5.

FIGS. 5, 6 and 7 illustrate a device used in conjunction with the pickup device for centering a semiconductor wafer and finding the flat edge of the wafer. FIG. 5 is the top view of the centering and orientation device 60. There are five rollers having a top roller 61a and a wafer orientation roller 61. There are four rollers 62 that engage the flat side of the wafer and two fiber optic cables 63.

A semiconductor wafer is placed down over the rollers 61,61a such that the edges of the wafer will slide down the tapered surface of top roller 61a and come to rest on the surface of orientation roller 61. When the rollers 61,61a are rotated, the semiconductor wafer will become centered, and rotation will continue until the flat edge of the semiconductor exposes the end of fiber optic light detector 63. At this time rotation of rollers 61, 61a stops and rollers 62 engage the flat side of the wafer.

Rollers 62 are spring loaded so that as the wafer rotates, the round edge of the wafer engages the rollers in a position toward the edge of the device 60, however when the flat part of the device rotates around to the location of the rollers 62, they will be drawn to the flat edge by springs. Light impinging on the end of the fiber optic indicates that the flat edge of the wafer is in the location of the fiber optics 63 and the flat edge rollers 62.

FIG. 6 is a side view of orientation device 60 showing the tapered surfaces of rollers 61 and 61a, and the vertical sides of rollers 62.

FIG. 7 is cross-sectional view taken through section 7—7 of FIG. 5. Centering orientation device 60 has an outer cover 69, a top base plate 86 and a bottom base plate 75. The mechanism for rotating rollers 61 and 61a is shown in detail at the right side of FIG. 7. Rollers are mounted on the top end of shaft 68, which is mounted in top and bottom bearings 66. The rollers are mounted at the end of shaft 68 and ride on roller table 65. A pulley 71 is mounded on the bottom end of shaft 68 on bushing 70. Shaft 68 is rotated by motor/gear combination 85,76. Gear 76 rotates pulley 72 which drives timing belt 72a, which drives pulley 71 on shaft 68.

Motor 85 also turns drive shaft 88 via gear 77. Drive shaft is mounted in bearings 87 and 88.

Figure 8:
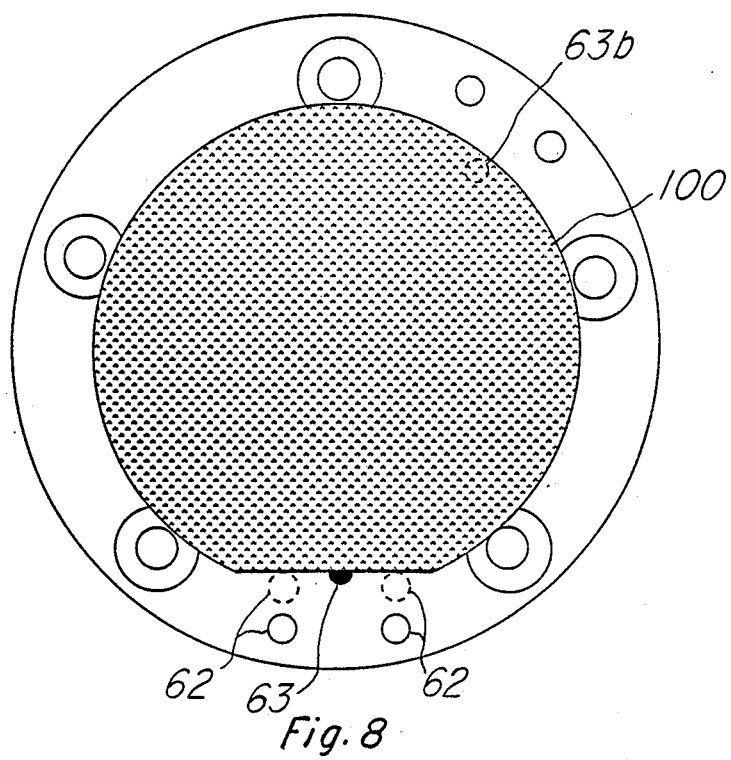
FIG. 8 illustrates a centered and orientated semiconductor wafer.

A wafer is lowered onto rollers 61 as shown in FIG. 5 and FIG. 8. The wafer is rotated by motor 84, drive shaft 83 and pulleys 71 and 82, with drive belt 72a. A preliminary location for the flat on the wafer is found by light sensor 63 and stops drive motor 84. The final location for the flat on the semiconductor wafer is determined when drive motor 85 turns gears 66 and 67, which in turn rotate cam 91, releasing flat finder 62. Springs AB pull the flat finder 62 toward the center of the centering device causing the wafer to be correctly oriented. At the same time rollers 61a rotate freely, thereby reducing friction and allowing a long or short rotation time a required to orientate the wafer. Once the wafer is orientated, the robotic pick-up device illustrated in FIGS. 3 and 4 can pickup the semiconductor wafer and place it in a wafer carrier.

FIG. 8 shows a semiconductor wafer 100 supported by rollers 61 and centered between the rollers 61a. Rollers 62 are illustrated in the extended position 62 in solid lines and retracted positions in dashed lines. Fiber optic end is shown at 63 at the flat edge of the wafer. The end of the fiber optic is shown in dashed lines, under the wafer at the second optical fiber location 63b. The pick-up device of FIGS. 3 and 4 picks-up the semiconductor device 100 and places it in the carrier 40 illustrated in FIG. 2.

What is claimed:

1. A pick-up device for moving a semiconductor wafer, the pick-up device being mounted on a mechanical or robotic arm having an extension, the pick-up device comprising:
    an upper plate;
    a lower pick-up head;
    two mounting posts having upper and lower ends, the upper ends being conical shaped; and
    a vacuum cavity in the pick-up head;
    the upper plate being attached to the upper ends of the two mounting posts,
    the lower pick-up head being attached to the lower ends of the two mounting posts,
    the two mounting posts resting within two holes in the robotic arm, but not fixedly attached to the robotic arm extension, such that when the robotic arm is lowered, the lower pick-up head remains parallel to the robotic arm extension until the lower pick-up head engages a semiconductor wafer, at which time the lower pick-up head moves in direction to position the pick-up head parallel to the semiconductor wafer independent of the orientation of the robotic arm extension with respect to the semiconductor wafer.

2. The pick-up device according to claim 1, wherein the lower pick-up head is of a high molecular weight material to prevent scratching the semiconductor wafer when the semiconductor wafer is held thereagainst during movement.

3. The pick-up device according to claim 1, wherein the pick-up head has a top surface and a bottom surface parallel to each other, and the vacuum cavity is formed in the bottom surface of the pick-up head, and opens into the top surface of the pick-up head through which a vacuum is pulled.

4. The pick-up device according to claim 3, wherein the vacuum cavity opening comprises the greatest part of the bottom surface of the pick-up head, the remaining part of the bottom of the pick-up head extending in an arc from the edge of the vacuum cavity opening to the top surface of the pick-up head.

5. The pick-up device according to claim 1, wherein the robotic arm extension includes a positioning block having two tapered holes therein in which the conical parts of the two posts reside, and are movable therefrom during the picking-up of a semiconductor wafer.

6. A pick-up device for moving a semiconductor wafer, the pick-up device being mounted on a mechanical or robotic arm having an extension, the pick-up device comprising, an upper plate, a lower pick-up head, two mounting posts having upper and lower ends, the upper ends being conical shaped, and a vacuum cavity in the pick-up head, the upper plate being attached to the upper ends of the two mounting posts, the lower pick-up head being attached to the lower ends of the two mounting posts, the two mounting posts resting within two round tapered holes in the robotic arm extension and removable therefrom during the picking-up of a semiconductor wafer, such that when the robotic arm is lowered the lower pick-up head remains parallel to the robotic arm extension until the lower pick-up head engages a semiconductor wafer at which time the lower pick-up head moves in a direction to position the pick-up head parallel to the semiconductor wafer independent of the orientation of the robotic arm extension with respect to the semiconductor wafer.

7. The pick-up device according to claim 6, wherein the robotic arm extension includes a positioning block having the two tapered holes therein in which the conical parts of the two posts reside, and are movable therefrom during the picking-up of a semiconductor wafer.

* * * * *